United States Patent
Hahn et al.

(10) Patent No.: US 9,786,800 B2
(45) Date of Patent: Oct. 10, 2017

(54) SOLAR CELL CONTACT STRUCTURE

(71) Applicant: SolarWorld Americas Inc., Hillsboro, OR (US)

(72) Inventors: Harald Hahn, Dresden (DE); Josh Yaskoff, Talladega, AL (US); Chris Stapelmann, Portland, OR (US); Thomas Kranke, Brand-Erbisdorf (DE); Roman Schiepe, Dresden (DE)

(73) Assignee: SolarWorld Americas Inc., Hillsboro, OR (US)

( * ) Notice: Subject to any disclaimer, the term of this patent is extended or adjusted under 35 U.S.C. 154(b) by 587 days.

(21) Appl. No.: 14/053,640

(22) Filed: Oct. 15, 2013

(65) Prior Publication Data

US 2015/0101661 A1    Apr. 16, 2015

(51) Int. Cl.
*H01L 31/0224*    (2006.01)
*H01L 31/036*    (2006.01)

(52) U.S. Cl.
CPC .... *H01L 31/022425* (2013.01); *H01L 31/036* (2013.01); *Y02E 10/50* (2013.01)

(58) Field of Classification Search
CPC ........ H01L 31/022425; H01L 31/036
See application file for complete search history.

(56) References Cited

U.S. PATENT DOCUMENTS

| | | |
|---|---|---|
| 2009/0162972 A1 | 6/2009 | Xu et al. |
| 2010/0037937 A1* | 2/2010 | Sater ............... H01L 31/022425 136/249 |
| 2011/0143486 A1 | 6/2011 | Hama et al. |
| 2013/0104975 A1 | 5/2013 | Krokoszinski |

FOREIGN PATENT DOCUMENTS

| | | |
|---|---|---|
| CN | 102077359 A | 5/2011 |
| CN | 102893406 A | 1/2013 |
| EP | 1833099 A2 | 9/2007 |
| TW | 201013951 A | 4/2010 |
| WO | 2010019685 A1 | 2/2010 |

OTHER PUBLICATIONS

Nadim Maluf et al., An Introduction to Microelectromechanical Systems Engineering, 2nd Edition, 2004, p. 16.*
Chinese Office Action based on application No. 201410398106.1 (7 pages and 8 pages of English translation) dated May 4, 2016.
Chinese Search Report based on application No. 201410398106.1 (1 page) dated Apr. 21, 2016.
Chinese Office Action based on application No. 201410398106.1 (8 pages) dated Dec. 8, 2016.

* cited by examiner

*Primary Examiner* — Shannon Gardner
(74) *Attorney, Agent, or Firm* — Viering, Jentschura & Partner mbB

(57) ABSTRACT

In various embodiments a solar cell may include a solar cell wafer substrate made of silicon having a major share of mono crystalline structure with {111} crystal plane parallel to one wafer edge; a dielectric layer disposed over the backside of solar cell wafer substrate; a plurality of contact openings extending through the dielectric layer to the solar cell wafer substrate; a plurality of metal contacts formed in the plurality of contact openings; and a metal layer disposed over the dielectric layer; wherein the metal layer is electrically coupled to the solar cell wafer substrate by means of the plurality of metal contacts; wherein at least one contact opening of the plurality of contact openings extends non parallel to {111} crystal plane.

15 Claims, 10 Drawing Sheets

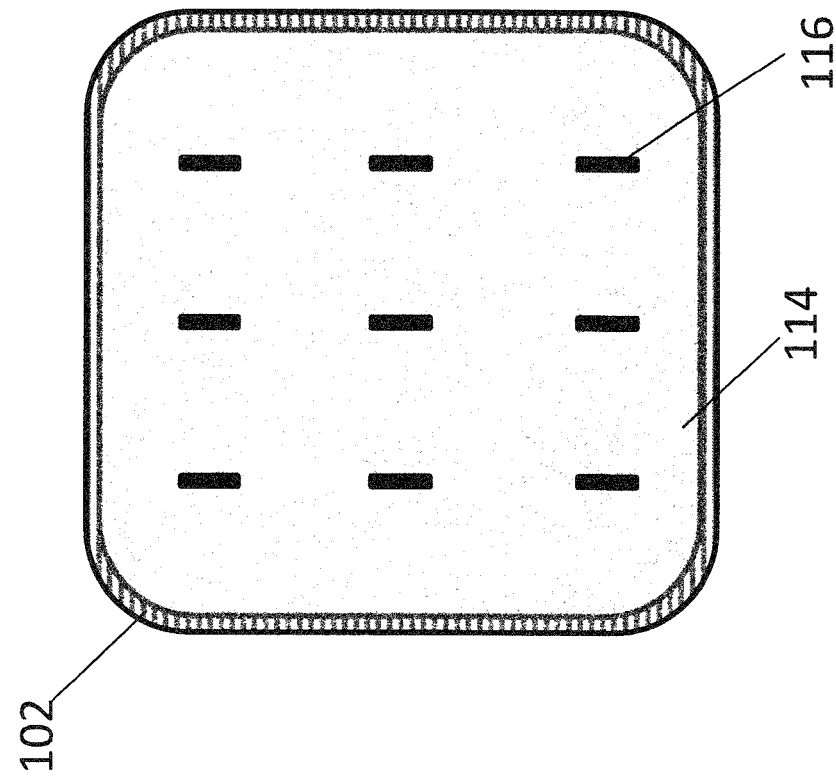
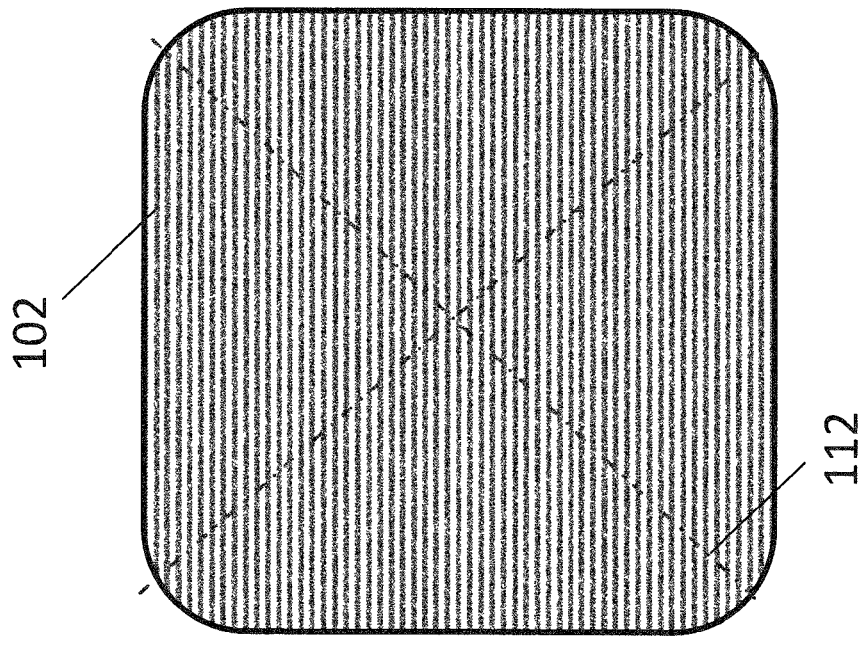

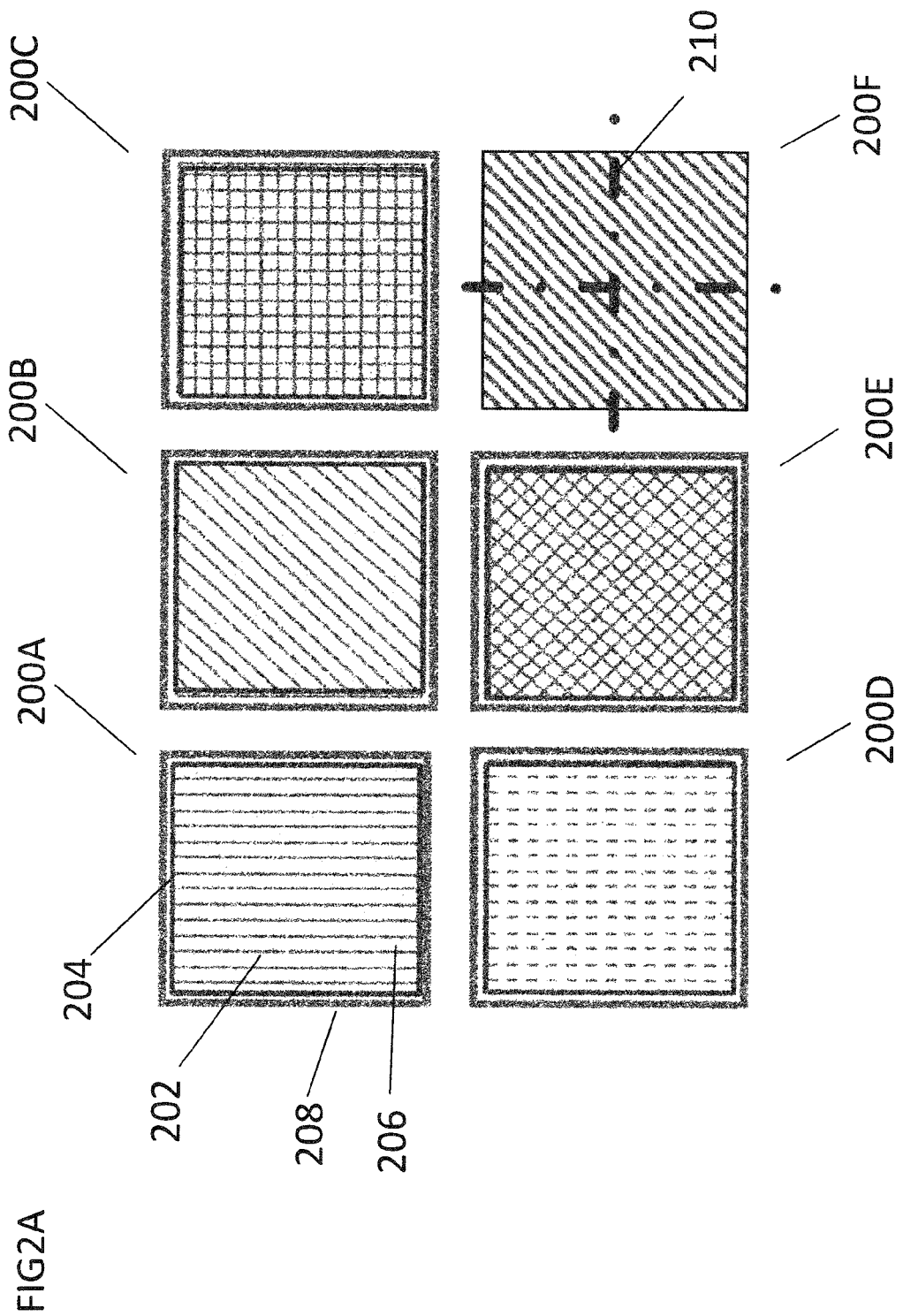

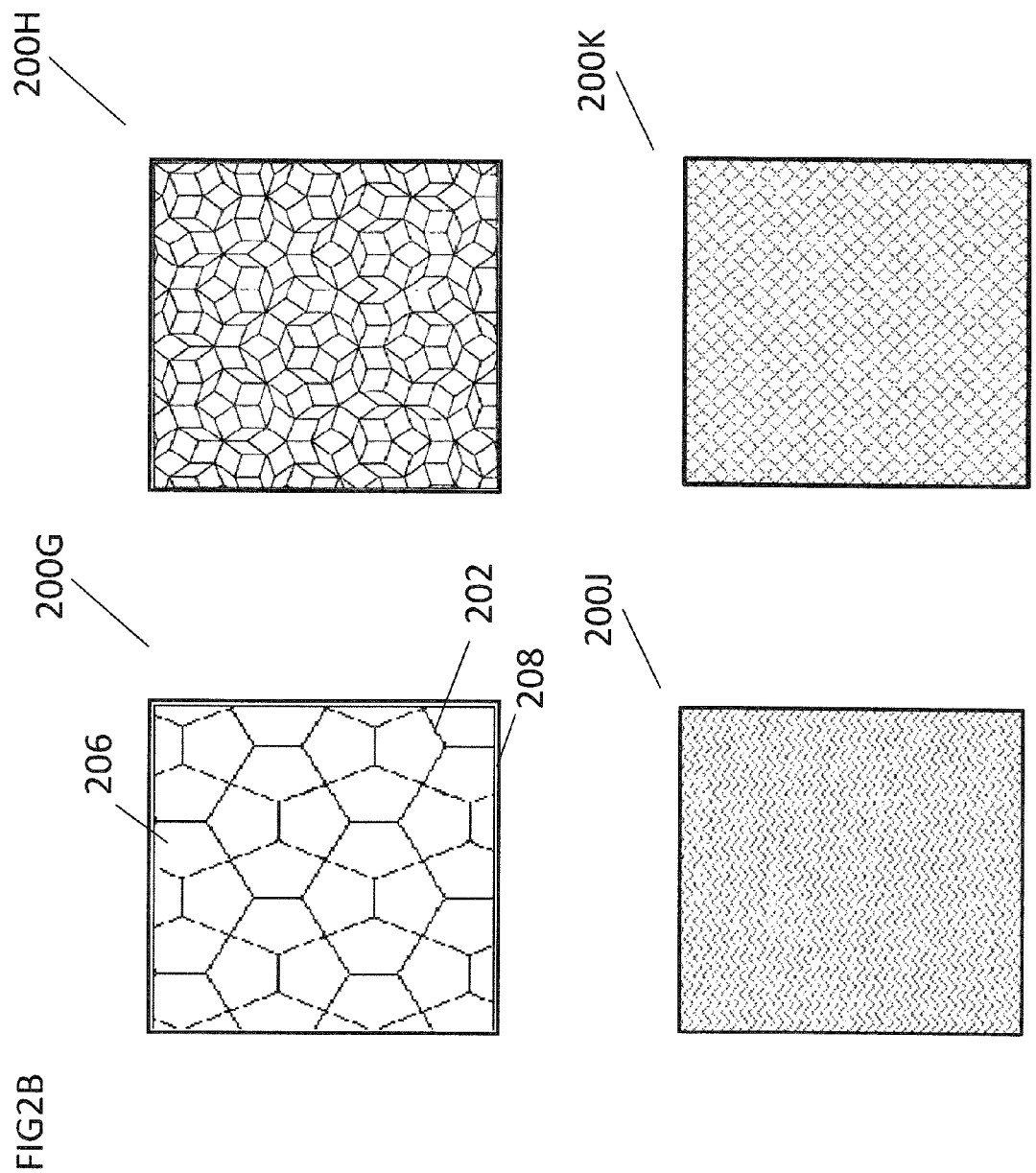

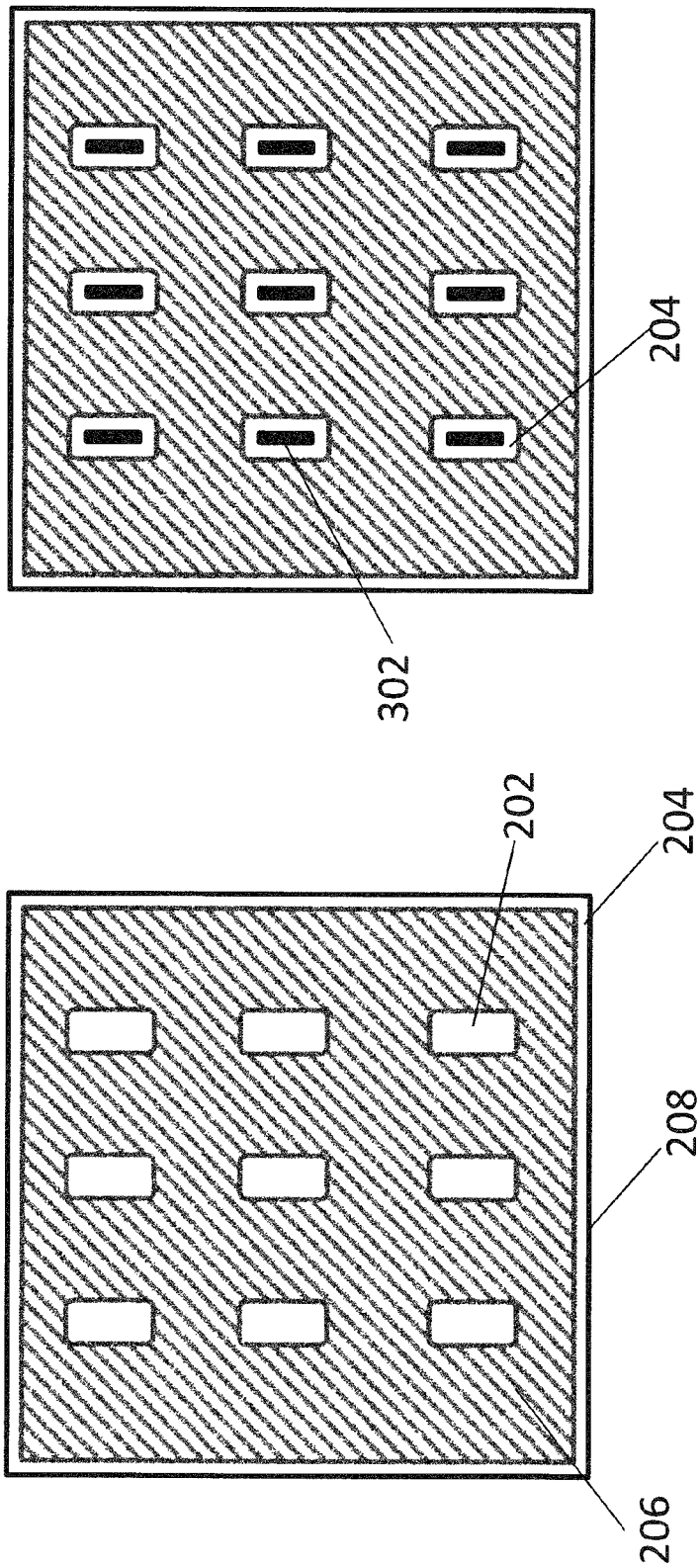

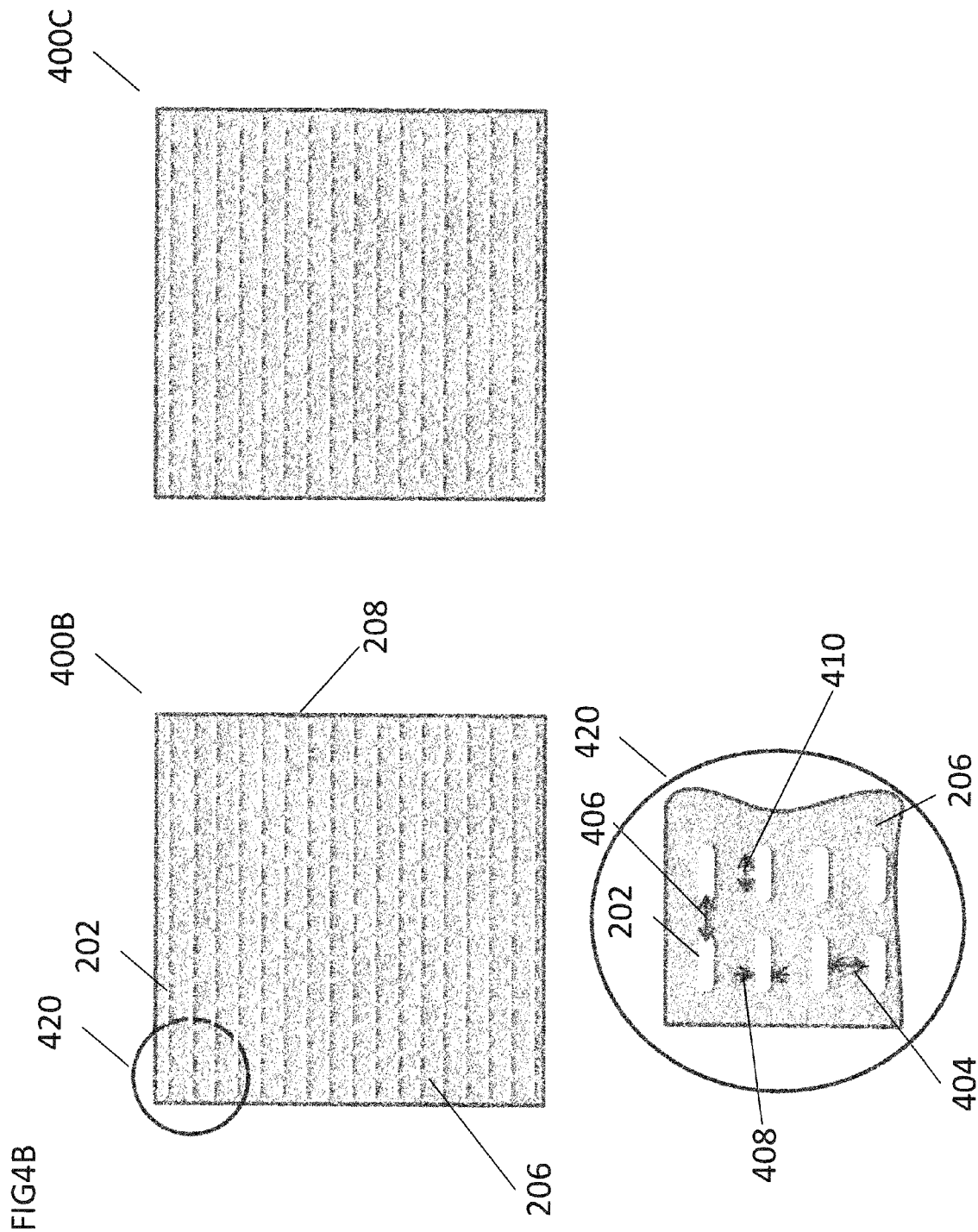

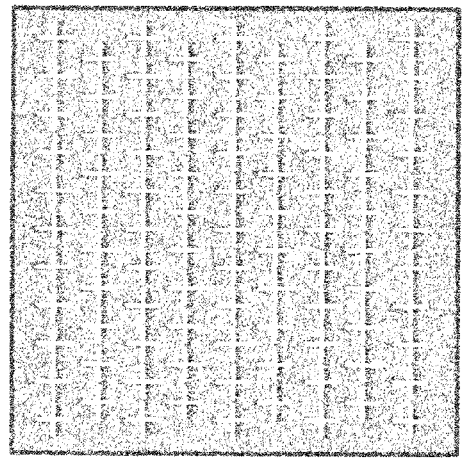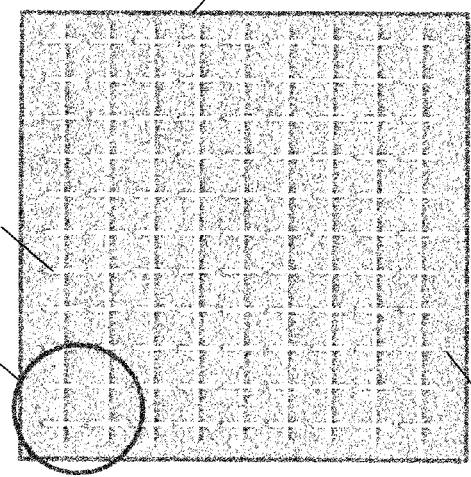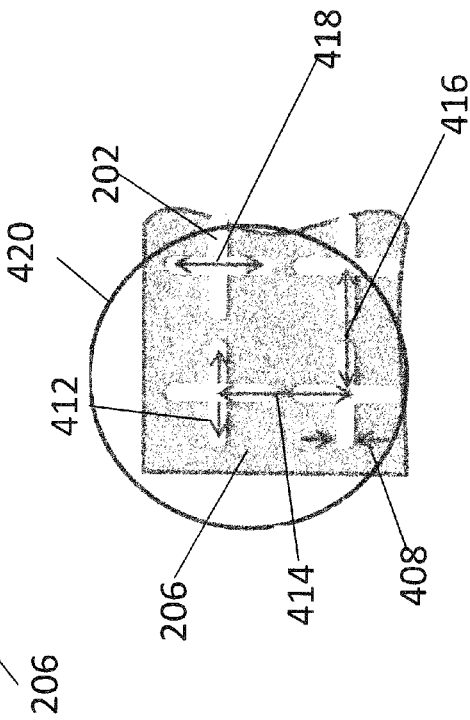

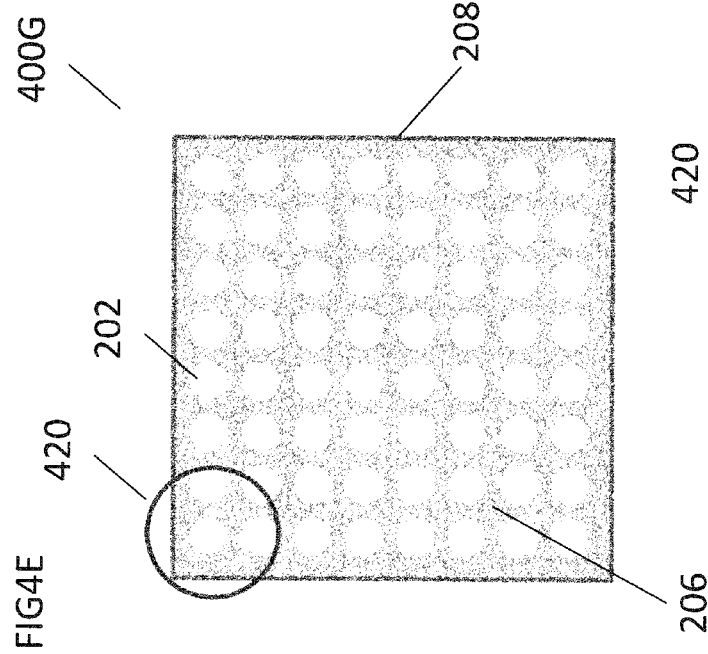
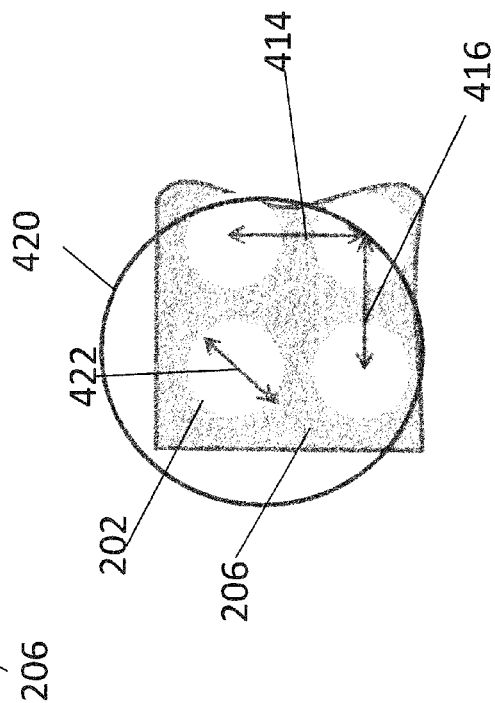
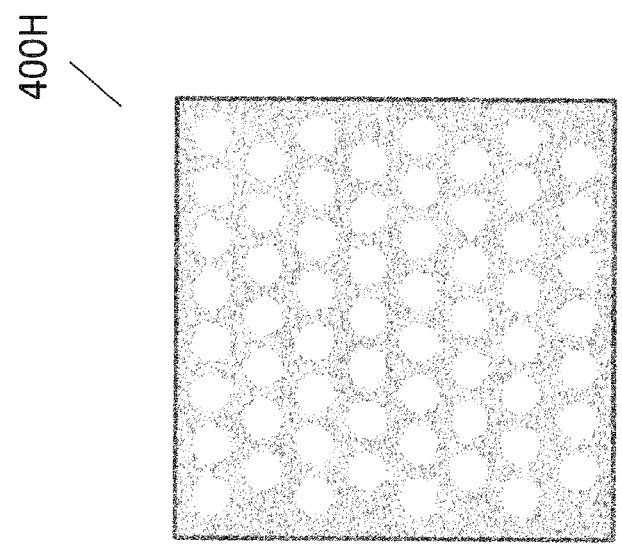

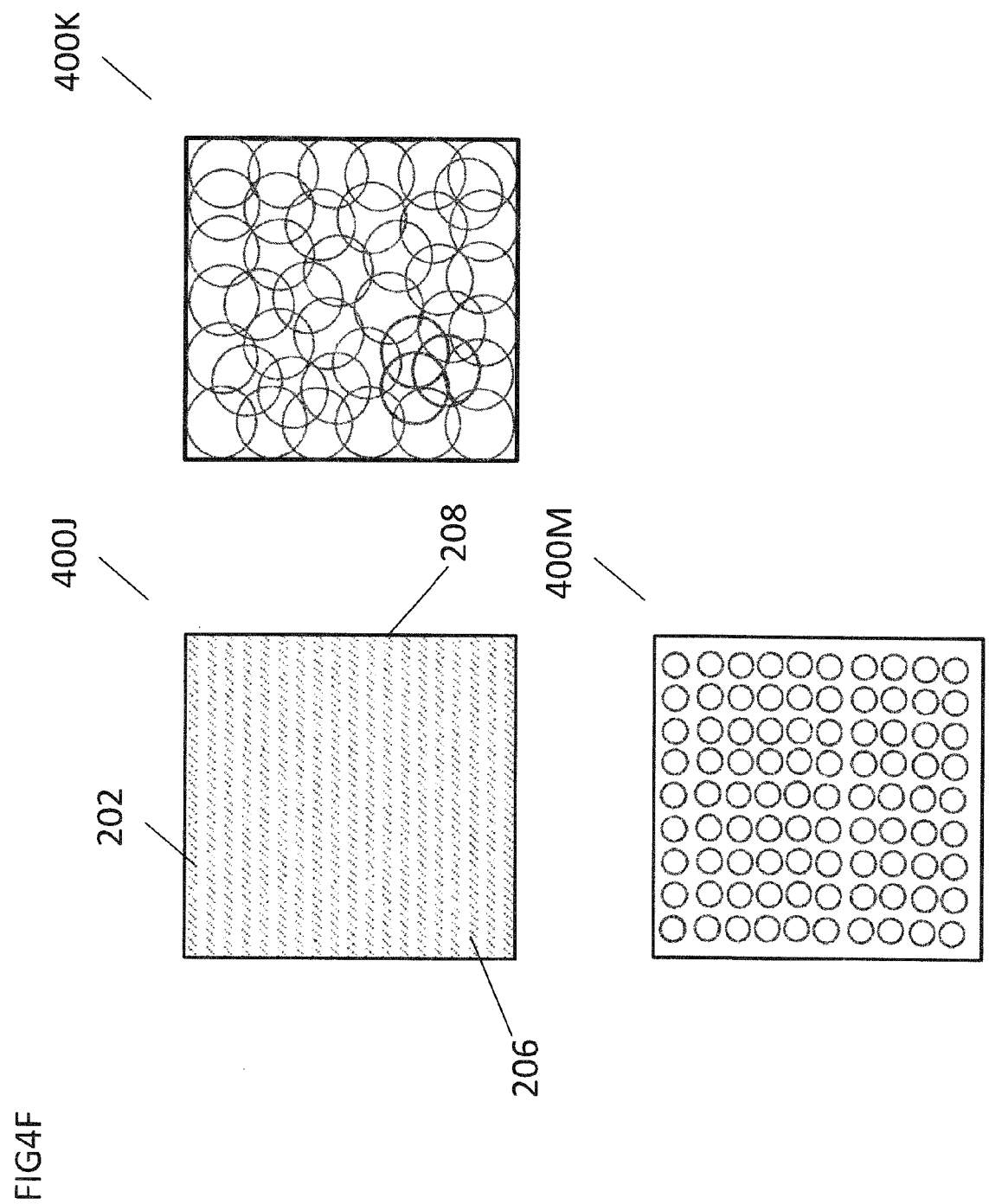

SOLAR CELL CONTACT STRUCTURE

TECHNICAL FIELD

Various embodiments relate generally to the contacting of solar cells.

BACKGROUND

As illustrated in FIG. 1A, local contact opening (LCO) lines 102 are formed on the back surface of the solar cell substrate of a common solar cell. A common solar cell is a PERC (passivated emitter and rear contact) cell design, laser fired contact (LFC) cell design or bifacial cell design with rear side contact grids. The LCO lines are laser cut trenches that are formed directly in the solar cell substrate, which is commonly consisting of silicon, or an interlayer, which is usually consisting of alumina, silicon nitride, silicon oxynitrid or another passivating material. Trenches are filled with a metal, which is usually aluminium. The metallization of the trenches may be formed by means of a screen printed metal containing paste. The solar cell with the paste is fired to form a metal in the trenches. The fired aluminum may flow to the end of the trenches such that aluminum pearls are formed. These pearls may be formed on every laser line. So far, there is no known solution to prevent the formation of these pearls. The bumps and point loads of these pearls may lead to an increase of the fracture rate of the solar cell. This may cause a breakage and cracking of the solar cells and may thus reduce the lifetime of solar modules.

Alternatively, the metallization of the LCO trenches may be achieved using any of the following examples: plating, vapor deposition techniques (e.g. PVD, CVD), and atomic layer deposition (ALD).

In a conventional solar cell, the LCO lines 102 are formed parallel to at least one edge of the solar cell substrate. Moreover, a conventional solar cell silicon substrate is formed such that the {110} crystal orientation is parallel to planar surface of the solar cell substrate. Therefore, the energetically preferable {111} crystal direction 112 of the solar cell silicon substrates is non parallel to the LCO lines 102.

The periodic orientation of LCO lines, and further of Ag pad structures, grid structures, Laser contacts of the solar cell, parallel to a crystal orientation of the solar cell substrate, e.g. parallel to the {110} crystal orientation in a quasi-monocrystalline PERC cell, may support the propagation of cracks in the solar cell substrate, e.g. in the {111} direction 112 of the solar cell substrate. Typically, the contact structures extend continuously or discontinuously parallel to crack propagation directions in the crystalline solar cell substrate. Local mechanical tensions of these periodically repeating continuous structures may add up to a larger linear tension line in the direction of a crystal orientation of the solar cell substrate. These linear tension lines may act like a perforation of the solar cell substrate and may reduce the stability of the solar cell parallel to LCO lines or solder pads. Therefore, a crack may propagate almost unhindered along the tension line without leaving this energetically preferred direction, e.g. the energetically preferred {111} direction 112 of the solar cell substrate. In other words, the periodic repetition of contact structures, e.g. bus bars, solder pads, grid finger, LCO on a solar cell may lead to a superposition of tension fields of single contact structures and may thus form tension lines. The extension of these tension lines may have a preferred direction in the solar cell substrate since this is anisotropic. In some solar cell designs, the direction of the tensions lines may be parallel to the {111} main crack propagation direction in a crystal direction of a silicon substrate, Further, in the processing and testing of a conventional solar cell module, an increase of the fracture rate and probability of crack formation is observable due to the decrease of solar cell substrate thickness, solar cell substrate crystal orientation and novel solar cell design concepts, e.g. in {110} quasi-monocrystalline PERC cells. Solar cells are usually exposed to various stress factors while processed, e.g. temperature stress during soldering; applying solar cell connectors to a solar cell with a different temperature expansion coefficient than the solar cell substrate; transport and handling of soldered solar cells, strings, laminates and modules, lamination of a solar cell or solar cell module by means of pressure and temperature stress. Further stress factors may be applied to a solar cell or solar cell module during the operating time, e.g. altering environmental temperature, weather inflicted mechanical stress, e.g. by wind and snow. These stress factors may partially be reduced in the processing by compensational means, e.g. altering the processing conditions, e.g. the lamination process, adaptation of soldering tips positions, use of double layered ethylene vinyl acetate (EVA) encapsulation. However, a complete reduction of stress factors might not be possible in the processing and operating time of the solar cell and solar cell module due to the solar cell design. The reduction of the fracture rate may be insufficient and mentioned solutions to reduce the fracture rate may be cost intensive and time consuming.

Moreover, the above described effects may become critical if multiple LCO lines are compromised. This may increase the probability of cracking of the solar cell, e.g. in {110} quasi-monocrystalline solar cells and {110} quasi-monocrystalline PERC cells. In this case, the main crack propagation direction may be parallel to the direction of the periodically repeating contact structures or to the direction of the extension of linear shaped contact structures.

In a conventional solar cell structure, the LCO lines 102 are paired with a full rear side metallization layer 114, which is typically aluminum. Solder pads 116 may be electrically connected with the solar cell substrate to provide an electrical connection access to the solar cell by printing these pads with firing solder paste. Alternatively, solder pads 116 may be printed with non firing paste. Those pads will remain on dielectric layer. The metal filled trenches 102 provide a contact between the solar cell substrate (cell base) and the solder pads 116 of the solar cell. The solder pads 116 are formed of, on or in the rear side metallization layer 114 on the LCOs 102. Further, a conventional solar cell may include solar cell bus bars on the solar cell substrate to increase the current distribution in the solar cell substrate. Conventional LCO lines 102 run perpendicular to solar cell bus bars and solder pads 116 (as illustrated in FIG. 1B).

Alternatively, the solder pad could be performed e.g. using any of the following deposition processes: plating, vapor deposition (e.g. CVD, PVD), and atomic layer deposition (ALD).

One disadvantage of this design usually is a power degradation, e.g. in the PERC technology, due to solder pad 116 deactivation if an LCO line 102 is interrupted or its connection to the solder pad 116 is lost. The cell current has to flow through the silicon base material to the next LCO line 102 resulting in a higher series resistance and a cell power loss. Further, the series resistance may increase during temperature cycling in the processing of the solar cell. Moreover, the full area rear metallization layer 114 may lead to a bow of the solar cell after the firing process and cooling down of the solar cell. The bow may be due to internal stresses between the layers e.g. between solder pads 116 made of silver in a metallization layer 114 made of aluminum. The stress may be caused by significantly different thermal expansion coefficients with respect to the solar cell substrate (CTE(Al): 23.1 ppm/K, CTE(Ag): 18.9 ppm/K, CTE(Si): 2.6 pp/K). The stresses created by a full back side metallization layer 114 can increase the likelihood of an LCO line 102 being compromised as described above. Further, the stresses may promote the formation of cracks within the solar cell substrate, e.g. in solar cell substrates formed of a brittle material, e.g. silicon.

SUMMARY

In various embodiments a solar cell may include a solar cell wafer substrate made of silicon having a crystal orientation; a dielectric layer disposed over the solar cell wafer substrate; a plurality of contact openings extending through the dielectric layer to the solar cell wafer substrate; a plurality of metal contacts formed in the plurality of contact openings; and a metal layer disposed over the dielectric layer; wherein the metal layer is electrically coupled to the solar cell wafer substrate by means of the plurality of metal contacts; wherein at least one contact opening of the plurality of contact openings extends with an angle with respect to the crystal orientation.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A and 1B show schematically different perspectives of a common contact structure;

FIGS. 2A and 2B show contact structures according to various embodiments;

FIGS. 3A and 3B show contact structures according to various embodiments; and FIGS. 4A to 4F show contact structures according to various embodiments.

DESCRIPTION

Figure 4A:
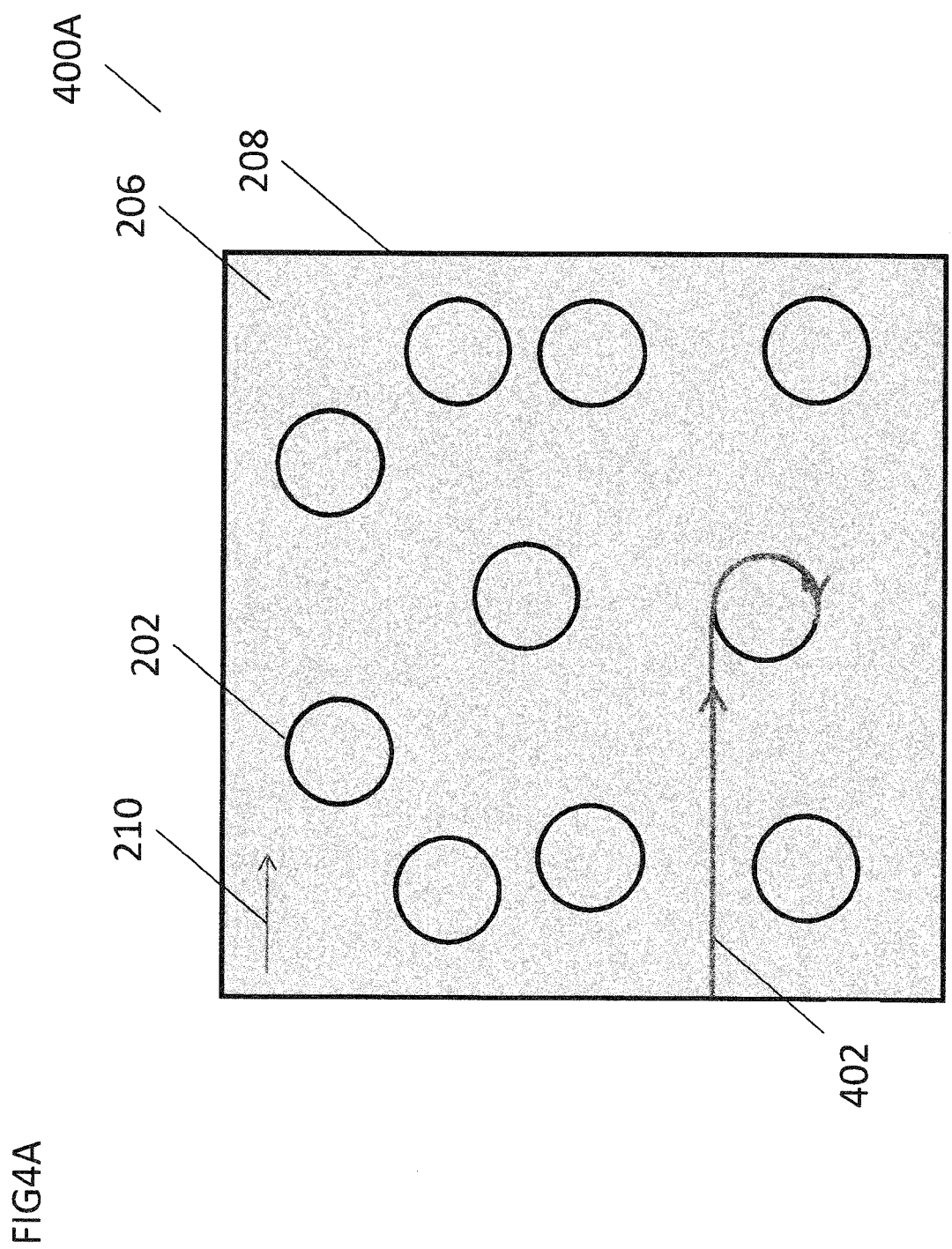

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

The solar cell may be a silicon solar cell of a type out of a group of the following types: a crystalline silicon solar cell, a thin-film solar cell, for example of silicon or other compounds, a concentrator solar cell, a multi-solar cell, an electrochemical dye-sensitized solar cell, an organic solar cell, a hybrid solar cell, a fluorescence solar cell, or a thermal photovoltaic solar cell. The solar cell may be formed in the form of one of the following types: aluminum plus solar cell (Alu+cell), with an upper phosphorous solar cell with aluminum back junction field and rear-side (n-type), n-type solar cell with a screen-printed solar cell with front connection (n-type); passivated on all sides of H-patterned solar cell (PASHA), with front and rear electrically conductive finger and busbar structures and without a cap opening and contact opening of the rear side; passivated emitter and rear side solar cell (PERC), and/or passivated emitter rear locally diffused cell (PERL).

In various embodiments, the solar cell may include a first electrode, a second electrode, and an optically active region between the first electrode and the second electrode. The first electrode may be formed directly on the optically active region, i.e. on the front side, in the beam path of the absorbable electromagnetic radiation. The electromagnetic radiation is converted into an electrical voltage and/or electric power in the optically active region.

The first electrode may be formed as a front side contact or front surface metallization. The front contact structure may be formed over the optically active region, for example as a finger-shaped metallization or in the form of a selective emitter or as a combination thereof. A patterned front side metallization is substantially formed only on the optically active region (except for electrical cross-links).

The optically active area of the solar cell may include an electrically conducting and/or semiconducting material, for example a doped silicon, for example a p-doped silicon (p-type), doped with boron, gallium and/or indium, for example, or a n-doped silicon (n type), doped with phosphorus, arsenic and/or antimony, for example. The optically active region may include a first region which may be doped with a different dopant than a second region, and has a physical contact with this. For example, the first region may be a p-type region (doped with a p-type dopant) and the second region may be a n-type region (doped with n-dopant), and vice versa. At the interface of the first region to the second region, a pn junction is formed that may generate electron-hole pairs. The optically active area may absorb electromagnetic radiation and form a photocurrent thereof. The optically active region may include a plurality of pn junctions, for example juxtaposed and/or superposed. The electromagnetic radiation may have a wavelength range of x-rays, ultraviolet radiation (A to C), visible light and/or infra-red radiation including (A to C).

On the shielded side of the solar cell, a backside contact structure may be formed. The back-contact structure may include the second electrode and a dielectric layer. The dielectric layer may be formed as a passivation layer.

The dielectric layer may include contact openings. A contact opening may be formed as local contact opening of the dielectric layer.

Contact pads may be formed on top of the contact openings on the dielectric layer. The contact pads may be electrically connected with the second electrode through the contact openings.

In various embodiments (as illustrated e.g. in FIG. 2A and FIG. 2B and FIG. 3A and FIG. 3B), a solar cell includes a solar cell wafer substrate 208 having a crystal orientation 210. The solar cell wafer substrate 208 may include at least one of a monocrystalline silicon substrate and a quasi-monocrystalline silicon substrate. The solar cell wafer substrate 208 may include a {100}, {110} or {111} crystal orientation. The crystal orientation 210 of the planar surface of the solar cell wafer substrate may be the {100}, {110} or {111} crystal orientation. In one embodiment, the solar cell wafer substrate 208 may be made of silicon having a major share of mono crystalline structure with {111} crystal plane parallel to one wafer edge. The main crack propagation direction of the solar cell wafer substrate may be parallel to or along the {111} direction of the solar cell substrate 208.

A dielectric layer 206 may be disposed over the solar cell wafer substrate 208. The dielectric 206 layer may be disposed over the backside of the solar cell wafer substrate 208, e.g. if the contact structure is formed on the rear side of the solar side. The dielectric layer 206 may be a passivation layer and may include a dielectric material, e.g. alumina, silicon oxide, silicon oxynitride, or silicon nitride.

A plurality of contact openings 202 extend through the dielectric layer 206 to the solar cell wafer substrate 208. At least one contact opening 202 of the plurality of contact openings may extend non parallel to {111} crystal plane (illustrated as embodiments 200A to 200K in FIG. 2A and FIG. 2B). In other words, at least one contact opening 202 of the plurality of contact openings may extend with an angle with respect to an edge of the solar cell wafer substrate 208. The extension with an angle may be of the kind of orientation and/or form of the contact openings 202 of the plurality of contact openings with respect to the edge of the solar cell substrate 208. In one aspect, at least one contact 202 opening of the plurality of contact openings may form a contact line 202. At least one contact opening 202 of the plurality of contact openings extends with an angle with respect to the crystal orientation of the solar cell substrate 208, e.g. the crystal orientation of the planar surface of the solar cell substrate 208 and/or the main crack propagation direction of the solar cell substrate 208, e.g. the {111} crystal direction of a solar cell silicon substrate 208. In one aspect, at least two contact openings 202 of the plurality of contact openings extends with an angle with respect to each other and/or to an edge of the solar cell wafer substrate 208.

The contact line 202 may extend with an angle of about 45° with respect to the edge of the solar cell wafer substrate 208—illustrated in the embodiments 200B, 200E, 200F, 200J. Further, contact opening lines may extend with an angle with respect to the main crack propagation direction of the solar cell wafer substrate, e.g. the {111} direction in a silicon based solar cell wafer substrate crystal orientation. The angle may be in the range from about 0° to about 90°, e.g. about 45°. In one aspect, the contact line may extend with an angle of about 45° with respect to the {111} crystal plane.

In one aspect, at least one contact opening 202 of the plurality of contact openings may be formed as a continued, interrupted or dotted contact line.

The contact line 202 may include at least one line portion having a wave line shape—illustrated in the embodiment 200J. A wave line shape may also be formed similar to a zigzag shape. A wave line shape may generally be described as a line shape with a periodic or an aperiodic change of the course of the direction of contact opening line.

The contact line 202 may include at least one line portion having a circular line shape—illustrated as embodiments 200C, 200D, 200G, 200H; also illustrated as embodiment 400A in FIG. 4A, embodiment 400K, 400M in FIG. 4F. A circular line shape may generally be described as a shape with a closed circumferential line.

Figure 4C:
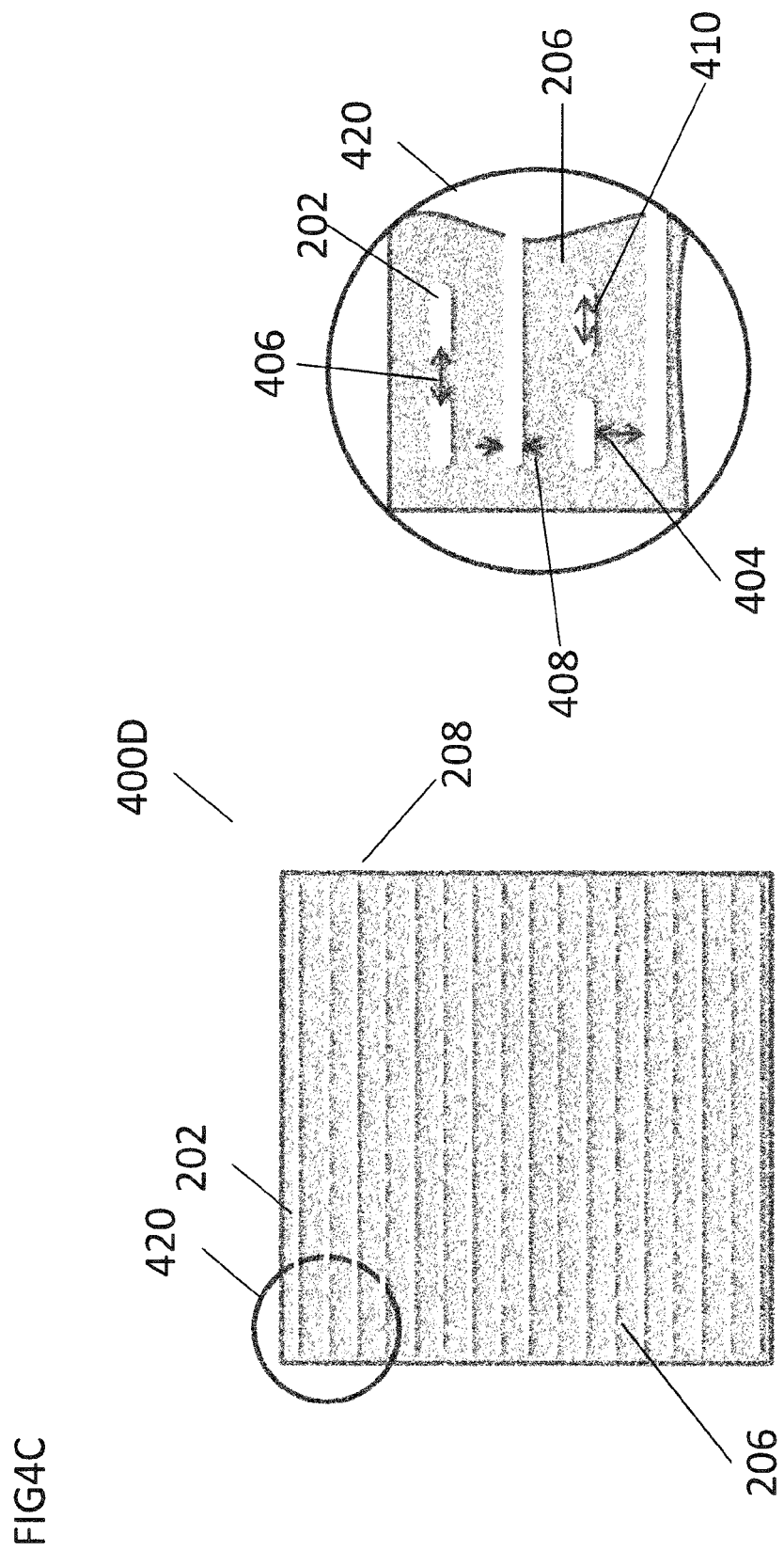

The contact line 202 may include at least one line portion having a dashed line shape—illustrated in the embodiment 200D; also illustrated in the embodiments 400B, 400C in FIG. 4B, the embodiment 400D in FIG. 4C and the embodiment 400J in FIG. 4F.

The contact line 202 may include at least one line portion having a crossed lines shape—illustrated in the embodiments 200C, 200E, 200G, 200H.

Cross hatch structures; net-shaped, triangle-shaped, honeycomb-shaped or grid-shaped structures may be formed such that these structures may be (substantially) free of periodic repetitions in the direction of the main crack propagation direction in the solar cell substrate, e.g. in the {111} direction of a silicon-based solar cell wafer substrate. The stability of the solar cell may be increased by interrupting continuously formed and crossed contact openings of cross hatch structures; net-shaped, triangle-shaped, honeycomb-shaped or grid-shaped structures such that they may include interruptions of the contact opening lines, e.g. with rounded or curved ends of the contact openings. Interruptions may be in the areas that are parallel to the main crack propagation direction—as illustrated in embodiment 400E with respect to the embodiment 200C. Further, the stability of the solar cell may be increased by reducing the periodic repetition of the interrupted grids in the main crack propagation direction—illustrated in the embodiment 400C with respect to the embodiment 400E. Further, the stability of the solar cell may be increased by contact openings 202 formed in rounded or curved shape. The radius of curvature should be sufficiently large to reduce localized mechanical tensions in the periphery of the contact openings.

The contact line 202 may include at least one line portion having a polygonal line shape—illustrated in the embodiment 200G, 200H.

In various embodiments, the at least one contact opening 202 of the plurality of contact openings may stop before an edge of the solar cell wafer substrate 208—illustrated in the embodiments 200A to 200E.

In various embodiments, the at least one contact opening 202 of the plurality of contact openings may be surrounded by a trench structure 204—illustrated in the embodiments 200A to 200E. The plurality of contact openings may be surrounded by a single trench structure 204—e.g. illustrated in the embodiments 200A to 200E; FIG. 2C. Single contact openings 202 with metal contacts within the contact openings 202 may be surrounded by a trench structure 204 that is formed by a larger extension of a contact opening 202 with respect to the extension of a metal contact—illustrated in FIG. 3B.

In FIG. 3A, a contact structure of a solar cell is illustrated with contact openings 202 in a dielectric layer 206. The contact openings are at least partially filled with a metal, e.g. by means of screen printing metal containing paste 302 into the contact openings 202—illustrated in FIG. 3B. The metal containing paste may be reduced into metal contacts by means of firing the solar cell wafer substrate, e.g. to remove organic components of the paste, e.g. binder. Thus, a plurality of metal contacts (illustrated in FIG. 3B) may be formed in the plurality of contact openings 202.

A metal layer may be disposed over the dielectric layer 206. The metal layer is electrically coupled to the solar cell wafer substrate 208 by means of the plurality of metal contacts.

A metal layer may cover a plurality of contact openings 202 of the plurality of contact openings. In one aspect, the metal layer may extend beyond the majority of contact openings 202. In various embodiments, the metal layer may include two or more segregated metal layers. Segregated metal layers may be as wide as covering multiple contact openings 202 or as narrow as a single contact opening 202. The reduced amount of metal layer on the rear side of the solar cell substrate 208 by means of segregated metal layers may reduce the bow of the solar cell substrate 208. Further, two or more segregated metal layer may allow multiple alignment options for the solar cell. In various embodiments, solder contacts may be formed on top or in the metallization layer or by the metal contacts. The solar cell may be electrically connected by forming a soldered electrical connection with the solder contacts. In other words, the metallization on the back side of the solar cell wafer substrate 208 may be modified to consist of stripes of metal that match the contact opening arrangement. Each metal stripe may cover one or multiple contact openings 202, e.g. contact opening lines. The screens for the screen printing for the metallization process may be modified to provide the desired arrangement. If a non-screen printing process is used (e.g. plating, CVD, PVD, ALD), a suitable mask may be used to provide the desired arrangement. A cross hatch metallization may be designed to result in a metal free area next to the solder pads in the direction of the cell bus bars to facilitate a robust soldering process.

Further, the angled and cross hatched contact opening design may provide many redundant current paths between the solder pads if a part of a contact opening line should fail. This redundancy is a feature of the cell design that increases the stability and reliability of a solar cell. This redundancy is applicable to crystalline and non-crystalline solar cells alike, regardless of crystal orientation. A striped rear side metallization may provide the minimum necessary current paths to the cell. It may provide a cost advantage through reduced paste consumption and may reduce the stress on the cell resulting in lower cell bow.

In various embodiments, the plurality of contact openings are arranged such that they form a contact opening arrangement which extends with an angle with respect to the crystal orientation—illustrated in FIG. 4A to FIG. 4F. In other words, contact opening lines may include interruptions in the opening of the dielectric layer such that segregated segments of contact openings 202 are formed. In one aspect, the contact opening arrangement may extend non parallel to {111} crystal plane. Similar, contact pads, contact sites, contact areas may include interruptions too. The interruptions may be formed such that the ends of a contact opening have curved or rounded corners, e.g. free of kinks.

The arrangement of contact openings may be a distribution of segregated contact openings. The arrangement of contact openings is formed such that a crack 402 may propagate in the solar cell wafer substrate 208 only until it reaches a contact opening—illustrated in FIG. 4A. The contact openings are formed such that a crack 402 is diverted from the main crack propagation direction 210. The crack 402 may be guided along the shape of a contact opening 202 and may stop its propagation as soon as the mechanical tension is relieved. Thus, the stability of the solar cell may be increased by means of the arrangement of the contact openings.

The arrangement of contact openings may extend with an angle with respect to an edge of the solar cell wafer substrate. The extension may be of the kind of orientation of contact openings in the arrangement—illustrated in the embodiments 400C, 400F, 400H, 400J; the shape or form of the arrangement of the contact openings—illustrated in the embodiment 400A to 400M and/or shape or form of the contact openings—illustrated in the embodiment 400A, 400E to 400H, 400K to 400M, In one aspect, the contact opening arrangement extends with an angle with respect to an edge of the solar cell wafer substrate, e.g. illustrated in the embodiment 400H in the form of an extended dashed or dotted contact opening line 202. The contact opening arrangement may form a contact line arrangement. The contact opening arrangement, e.g. the contact line arrangement, may extend with an angle of about 45° with respect to the edge of the solar cell wafer substrate. In one aspect, the contact line arrangement may include at least two contact lines crossing at an angle with respect to each other and/or to the edge of the solar cell wafer substrate 208.

In one aspect, the contact line arrangement may form an aperiodic arrangement—illustrated in the embodiments 400A, 400K. In other words, the contact line arrangement may form an aperiodic arrangement of contact openings. The aperiodic arrangement may include an aperiodic distribution of contact openings 202.

In one aspect, the contact line arrangement may form a periodic arrangement—illustrated in the embodiments 400B to 400J, 400M. The periodic arrangement may include a periodic distribution of contact openings 202.

The contact opening arrangement, e.g. the contact line arrangement, and/or the contact openings 202 of the contact opening arrangement may include at least one line portion having a wave line shape arrangement.

The contact opening arrangement and/or the contact openings 202 of the contact opening arrangement may include at least one line portion having a circular line shape arrangement—illustrated in the embodiments 400A, 400G, 400H, 400K and 400M.

The contact opening arrangement and/or the contact openings 202 of the contact opening arrangement may include at least one line portion having a polygonal line shape arrangement.

The contact opening arrangement and/or the contact openings 202 of the contact opening arrangement may include at least one line portion having a dashed line shape arrangement—illustrated in the embodiments 400B to 4003, 400M.

The contact opening arrangement and/or the contact openings 202 of the contact opening arrangement may include at least one line portion having a cross line shape arrangement—illustrated in the embodiments 400D, 400F.

The contact opening arrangement and/or the contact openings 202 of the contact opening arrangement may include at least one line portion having a dotted line shape arrangement—illustrated in the embodiments 400B to 400F, 400M.

The contact opening arrangement may stop before an edge of the solar cell wafer substrate.

In various embodiments, the contact opening arrangement may be surrounded by a trench structure 204. In one aspect, the majority of contact openings 202 may be surrounded by a trench structure 204, e.g., a trench structure 204 formed as a frame like opening structure. In various embodiments, the metal layer may cover a plurality of contact openings 202 of the arrangement of contact openings. In one aspect, the contact opening arrangement may be crossed by a trench structure.

A dashed line arrangement of contact openings 202, e.g. illustrated in FIG. 4B and FIG. 4C, may have a space 406 between adjacent contact openings 202 in the range from about 100 µm to about 1500 µm; a length 410 of a contact opening 202 in the range from about 100 µm to about 1500

μm; a width 408 of a contact opening 202 in the range from about 25 μm to about 150 μm; and a pitch 404 of adjacent contact openings 202 in the range from about 0.5 mm to about 2 mm. The contact openings 202 may be arranged in the form of a rectangle, e.g. a square—illustrated in the embodiment 400B, arranged in the form of a displaced rectangle, e.g. a displaced square—illustrated in the embodiment 400C, or a mixture thereof. In various embodiments, the contact openings 202 may be arranged parallel or turned for about 90° with respect to the contact fingers of the front side contact of the solar cell. A dashed line arrangement of contact openings 202 may include contact openings 202 formed as layout lines, e.g. illustrated in FIG. 4C. In various embodiments, the contact openings arrangement with contact openings 202 formed as layout lines and dashed lines may be formed turned by about 90° with respect to the contact fingers of the front side contact of the solar cell. The contact openings 202 having dashed contact openings (400B to 400D) may be arranged such that a distance in the range from about 0.5 mm to about 2.0 mm is formed with respect to the edge of the solar cell wafer substrate 208.

The contact opening arrangement may include contact openings 202 in form of a cross in a dashed contact opening arrangement, e.g. illustrated in FIG. 4D. The cross formed contact openings 202 may have a horizontal length 402 of a contact opening 202 in the range from about 100 μm to about 500 μm; a vertical length 418 of a contact opening 202 in the range from about 100 μm to about 500 μm; a horizontal space 414 (center to center) of adjacent contact openings in the range from about 500 μm to about 1500 μm; a vertical space 416 (center to center) of adjacent contact openings 202 in the range from about 500 μm to about 1500 μm and a width 408 of a contact opening in the range from about 25 μm to about 150 μm. The contact openings 202 may be arranged in the form of a rectangle, e.g. a square—illustrated in the embodiment 400E, arranged in the form of a displaced rectangle, e.g. a displaced square—illustrated in the embodiment 400F, or a combination thereof. The contact openings having cross formed contact openings (400E, 400F) may be arranged such that a distance in the range from about 0.5 mm to about 2.0 mm is formed with respect to the edge of the solar cell wafer substrate 208.

The contact opening arrangement may include contact openings 202 in form of dots, circles, ovals or rings in a dashed contact opening arrangement, e.g. illustrated in FIG. 4E. The dots, circles or rings formed contact openings 202 may have a diameter 422 in the range from about 80 μm to about 150 μm; a horizontal space 416 (center to center) of adjacent contact openings in the range from about 400 μm to about 1500 μm; a vertical space 416 (center to center) of adjacent contact openings in the range from about 400 μm to about 1500 μm. The contact openings 202 may be arranged in the form of a rectangle, e.g. a square—illustrated in the embodiment 400G, arranged in the form of a displaced rectangle, e.g. a displaced square—illustrated in the embodiment 400H, or a combination thereof. The contact openings having a cross shape may be arranged such that a distance in the range from about 0.5 mm to about 2.0 mm is formed with respect to the edge of the solar cell wafer substrate 208. The contact openings 202 in form of dots, circles, ovals or rings may be distributed or patterned in a periodic or aperiodic way, e.g. statistically distributed. In one embodiment, contact openings 202 in form of dots, circles, ovals or rings may be formed at intersections of a Penrose tiling.

The contact openings 202 of the contact opening arrangement may be segregated—e.g. illustrated in embodiment 400G, 400M; or may be connected e.g. illustrated in embodiment 400K, 200A.

To create a redundant contact opening arrangement on the back side of a solar cell as described above, the common PERC contact opening process may be modified in that the contact opening lines 202 are cut by the laser at an angle, e.g. in a 45° cross hatched arrangement. The line pitch may be optimized to reduce resistance losses, maximize backside passivation and tool capacity. Above described contact openings and/or contact opening arrangements may suppress a linear crack propagation in the solar cell wafer substrate 208 since their orientation, repetition and/or periodicity (and therefore their mechanical tension field) deviates from the main crack propagation direction—in the {111} direction of the solar cell wafer substrate 208. This may increase the stability of thin solar cells and quasi-monocrystalline PERC solar cells since the main crack propagation direction is orientated in those solar cells parallel to the extension of solder pads and contact opening lines 202. Aperiodic contact opening arrangements and/or contact openings 202, e.g. a Penrose tiling or statistical forms and arrangements, may isotropically distribute mechanical tensions. Further, periodic contact opening arrangements and/or contact openings 202 that extend with an angle with respect to the crystal orientation of the planar surface the solar cell wafer substrate may also isotropically distribute mechanical tensions. A crack 402 may propagate in solar cells with an above described contact structure only a short way in the {111} direction until it reaches a transversely tension field of a contact opening 202. The transversely tension field may direct the crack out of its propagation direction and may stop its further propagation. An aperiodic contact opening arrangement with an area wide coverage of a side of the solar cell, e.g. Penrose tiling shaped, may isotropically distribute mechanical tension in a planar area of the solar cell. Thus, those contact opening arrangements may be free of linear tension lines or periodically repetitive tension dots that may correlate with a crack propagation direction of the solar cell. A crack 402 may therefore be hindered in propagating along the stress peaks in the metallization or along the main crack propagation direction of the solar cell wafer substrate. Such propagation would require a change of the course of the crack propagation. Therefore, the crack propagation is reduced and the stability in the solar cell increased.

In various embodiments, the contact openings 202 and/or the contact opening arrangement is formed such that the amount of structures is reduced that allow an unhindered propagation of cracks in the solar cell wafer substrate 208. Those structures may have a periodically repetitive structure, may have an acute angle or may have continuous contact opening lines parallel to the crystal direction, e.g. the main crack propagation direction (the {111} direction in silicon). This may be realized by a deviation of the symmetry of the metallization structures, with respect to crystal symmetry of the solar cell wafer substrate, In various embodiments, a contact structures are described that may increase the stability of solar cells and solar cell modules.

In various embodiments, a solar cell may include a solar cell wafer substrate made of silicon having a major share of mono crystalline structure with a {111} crystal plane parallel to one wafer edge; a dielectric layer disposed over the solar cell wafer substrate; a plurality of contact openings extending through the dielectric layer to the solar cell wafer substrate; a plurality of metal contacts formed in the plurality of contact openings; and a metal layer disposed over the dielectric layer; wherein the metal layer is electrically coupled to the solar cell wafer substrate by means of the plurality of metal contacts; wherein at least one contact opening of the plurality of contact openings extends non parallel to the {111} crystal plane.

In various embodiments, the dielectric layer may be disposed over the backside of the solar cell wafer substrate, e.g. as part of a rear side of a solar cell waver substrate contact structure. In various embodiments, the dielectric layer may be disposed over the front side of the solar cell wafer substrate, e.g. as a part of a front side of a solar cell waver substrate contact structure.

In various embodiments, the solar cell wafer substrate may include at least one of a monocrystalline silicon substrate and a quasi-monocrystalline silicon substrate. In various embodiments, the solar cell wafer substrate may include one of the following materials or is formed thereof: indium, gallium, arsenic, phosphorus, boron, carbon.

In various embodiments, the solar cell wafer substrate may include a {100}, {110} or {111} crystal orientation. The crystal orientation of the planar surface the solar cell wafer substrate may be {100}, {110} or {111}.

In various embodiments, the at least one contact opening of the plurality of contact openings may extend with an angle with respect to an edge of the solar cell wafer substrate, e.g. with respect to the crystal direction of the planar surface of solar cell wafer substrate or with respect to a propagation direction of cracks in the solar cell wafer substrate. In various embodiments, at least two contact openings of the plurality of contact openings may extend with an angle with respect to each other and/or to an edge of the solar cell wafer substrate. A propagation direction of cracks in the solar cell wafer substrate is a direction within the solar cell waver substrate that may release mechanical stress or tension of the substrate by the formation of a crack along this direction. The main propagation direction in silicon is the {111} direction. The extension may be of the kind of orientation and/or form of the contact openings of the plurality of contact openings.

In various embodiments, at least one contact opening of the plurality of contact openings may form a contact line. In various embodiments, at least one contact opening of the plurality of contact openings may form a continued, interrupted or dotted contact line. The contact line may extend with an angle of about 45° with respect to the edge of the solar cell wafer substrate and/or {111} crystal plane. The contact line may include at least one line portion having a line shape selected from the following line shapes: a wave line shape; a circular line shape; and a polygonal line shape. This contact lines may be paired with either a full metallization layer, e.g. a full rear side metallization, or thin metal lines (stripes) over the top of contact openings. In various embodiments, the at least one contact opening may be formed as an aperiodic structure in the passivating layer or solar cell substrate, e.g. similar to a meander, fractal or randomly shape.

In various embodiments, the at least one contact opening of the plurality of contact openings may stop before an edge of the solar cell wafer substrate. This may reduce the probability of a crack to enter the solar cell wafer substrate. In various embodiments, the majority of contact openings may stop before an edge of the solar cell wafer substrate.

In various embodiments, the at least one contact opening of the plurality of contact openings is surrounded by a trench structure. The trench structure may prevent the formation of pearls of fired metal from the contact openings and therefore may increase the stability of the solar cell. The trench structure may be formed as a groove, gully, ditch, hole or as a framed laser line. The trench structure may be formed as merged structure such that fired metal may not form pearls that are exposed with respect to the surface level of the passivation layer or trench surrounding layer. In one embodiment, the plurality of contact openings may be surrounded by a single trench structure. The single trench structure may merge the ends of two or more contact openings. In one embodiment, the trench structure may be formed as a frame like contact opening structure. In one embodiment, the majority of contact openings may be surrounded by a frame like opening structure.

In various embodiments, the metal layer may cover a plurality of contact openings of the plurality of contact openings. In various embodiments, the metal layer may extend beyond the majority of contact openings.

In various embodiments a solar cell may include a solar cell wafer substrate made of silicon having a crystal orientation; a dielectric layer disposed over the solar cell wafer substrate; a plurality of contact openings extending through the dielectric layer to the solar cell wafer substrate; a plurality of metal contacts formed in the plurality of contact openings; and a metal layer disposed over the dielectric layer; wherein the metal layer is electrically coupled to the solar cell wafer substrate by means of the plurality of metal contacts; wherein the plurality of contact openings are arranged such that they form a contact opening arrangement which extends with an angle with respect to the crystal orientation.

In various embodiments, the arrangement may extend non parallel to a {111} crystal plane.

In various embodiments, the dielectric layer may be disposed over the backside of the solar cell wafer substrate, e.g. as part of a rear side of a solar cell waver substrate contact structure. In various embodiments, the dielectric layer may be disposed over the front side of the solar cell wafer substrate, e.g. as a part of a front side of a solar cell wafer substrate contact structure.

In various embodiments, the solar cell wafer substrate may include at least one of a monocrystalline silicon substrate and a quasi-monocrystalline silicon substrate. In various embodiments, the solar cell wafer substrate may include one of the following materials or is formed thereof: indium, gallium, arsenic, phosphorus, boron, carbon.

In various embodiments, the solar cell wafer substrate may include a {100}, {110} or {111} crystal orientation. The crystal orientation of the planar surface the solar cell wafer substrate may be {100}, {110} or {111}.

In various embodiments, the arrangement of contact openings may extend with an angle with respect to an edge of the solar cell wafer substrate. The extension may be of the kind of orientation and/or form of the arrangement of contact openings.

In one aspect, the contact opening arrangement extends with an angle with respect to an edge of the solar cell wafer substrate, e.g, with respect to the crystal direction of the planar surface of solar cell wafer substrate or with respect to a propagation direction of cracks in the solar cell wafer substrate. The contact opening arrangement may form a contact line arrangement. The contact opening arrangement, e.g. the contact line arrangement, may extend with an angle of about 45° with respect to the edge of the solar cell wafer substrate. In various embodiments, the contact line arrangement may include at least two contact lines crossing at an angle with respect to each other and/or to the edge of the solar cell wafer substrate.

In various embodiments, the contact line arrangement may form an aperiodic arrangement. The aperiodic arrangement may include an aperiodic distribution of contact openings. These aperiodic arrangement and/or contact opening forms may distribute mechanical tensions homogenously in different directions or may generate tension fields that are non-parallel to at least one preferable crack propagation direction in the solar cell wafer substrate. In various embodiments, the contact line arrangement may form an aperiodic arrangement of contact openings. In various embodiments, the contact openings may be formed as an aperiodic grid in the passivating layer or solar cell substrate, e.g. a Penrose tiling or statistical distribution. The contact opening arrangement may be formed by continuous lines, networks, grids and/or discontinuous lines. In various embodiments, the contact opening arrangement may include ring shaped contact openings. The contact openings may be formed isolated from one another. Non-contacting or mechanically non-interacting may prevent a point wise transmission of stress or tension into the solar cell substrate wafer. Moreover, aperiodic arrangements may prevent a statistically local parallel orientation to a crystal orientation of a multicrystalline substrate, e.g. the {111} direction of the crystalline solar cell wafer substrate.

In various embodiments, the contact line arrangement may form a periodic arrangement. The periodic arrangement may include a periodic distribution of contact openings.

In various embodiments, the contact opening arrangement, e.g. the contact line arrangement, may include at least one line portion having a line shape selected from of the following line shape arrangements: a wave line shape arrangement; a circular line shape arrangement; a polygonal line shape arrangement; a dashed line shape arrangement; a cross line shape arrangement; and a dotted line shape arrangement. These contact line arrangements may be paired with either a full metallization layer, e.g. a full rear side metallization, or thin metal lines (stripes) over the top of contact openings.

In various embodiments, the contact opening arrangement may stop before an edge of the solar cell wafer substrate. In one aspect, the majority of contact openings 202 may stop before an edge of the solar cell wafer substrate 208.

In various embodiments, the contact opening arrangement may be surrounded by a trench structure.

In various embodiments, the metal layer may cover a plurality of contact openings of the plurality of contact openings.

In various embodiments, a solar cell is provided. The solar cell may include a solar cell wafer substrate made of silicon; a dielectric layer disposed over the backside of solar cell wafer substrate; a plurality of contact openings extending through the dielectric layer to the solar cell wafer substrate; a plurality of metal contacts formed in the plurality of contact lines; and a metal layer disposed over the dielectric layer; wherein the metal layer is electrically coupled to the solar cell wafer substrate by means of the plurality of metal contacts; wherein the plurality of contact lines are arranged such that at least two contact lines are crossing each other.

In various embodiments, the at least two crossing contact lines of the plurality of contact lines may form a continued, interrupted or dotted contact line.

In various embodiments, the solar cell wafer substrate may be made of crystalline or amorphous substrate.

In various embodiments, the solar cell wafer substrate may be made of multi crystalline silicon.

In various embodiments, the solar cell wafer substrate may be made of mono crystalline silicon.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A solar cell, comprising:
a solar cell wafer substrate comprising silicon having a major share of mono crystalline structure with a {111} crystal plane parallel to at least one wafer edge, wherein the at least one wafer edge is on a perimeter of the solar cell wafer substrate;
a dielectric layer disposed over the backside of the solar cell wafer substrate;
a plurality of contact openings extending through the dielectric layer to the solar cell wafer substrate;
a plurality of metal contacts formed in the plurality of contact openings; and
a metal layer disposed over the dielectric layer;
wherein the plurality of metal contacts electrically couple the metal layer to the solar cell wafer substrate;
wherein at least one contact opening of the plurality of contact openings extends non parallel to the {111} crystal plane.

2. The solar cell of claim 1,
wherein at least two contact openings of the plurality of contact openings extend with an angle with respect to each other and to an edge of the solar cell wafer substrate.

3. The solar cell of claim 1,
wherein at least one contact opening of the plurality of contact openings is a continuous or interrupted line in the dielectric layer.

4. The solar cell of claim 1,
wherein at least one of the plurality of contact openings extends with an angle of about 45° with respect to the {111} crystal plane.

5. The solar cell of claim 1,
wherein at least one of the plurality of contact openings has a line shape selected from a group consisting of:
a wave line;
a circle; and
a polygonal shape.

6. The solar cell of claim 1,
wherein the metal layer extends beyond a majority of the plurality of contact openings.

7. The solar cell of claim 1,
wherein a majority of the plurality of contact openings stop before an edge of the solar cell wafer substrate.

8. The solar cell of claim 1,
wherein a majority of the plurality of contact openings are surrounded by a frame like opening structure near the perimeter of the solar cell wafer substrate, wherein the frame like opening structure comprises a trench in the solar cell substrate.

9. The solar cell of claim 1,
wherein the plurality of contact openings are arranged such that they form a contact opening arrangement which extends non parallel to the {111} crystal plane.

10. The solar cell of claim 9,
wherein the contact opening arrangement comprises at least two contact openings crossing at an angle with respect to each other and to the edge of the solar cell wafer substrate.

11. The solar cell of claim 9,
wherein the contact opening arrangement forms an aperiodic arrangement of contact openings.

12. The solar cell of claim 1, wherein the solar cell is a passivated emitter rear contact (PERC) solar cell and the metal layer comprises metal strips that match the plurality of contact openings, wherein the metal strips are configured to establish an increased amount of contact area with the plurality of metal contacts.

13. A solar cell, comprising:
a solar cell wafer substrate comprising silicon having a major share of mono crystalline structure with a {111} crystal plane parallel to one wafer edge, wherein the one wafer edge is on a perimeter of the solar cell wafer substrate;
a dielectric layer disposed over the backside of the solar cell wafer substrate;
a contact opening structure extending through the dielectric layer to the solar cell wafer substrate, wherein the contact opening structure comprises at least a first contact opening section;
a metal contact structure formed in the contact opening structure; and
a metal layer disposed over the dielectric layer;
wherein the metal contact structure electrically couples the metal layer to the solar cell wafer substrate;
wherein the first one contact opening section is non parallel to the {111} crystal plane.

14. The solar cell of claim 13,
wherein at least a second contact opening section of the contact opening structure extends at an intersecting angle with respect to the first contact opening section and to an edge of the solar cell wafer substrate.

15. The solar cell of claim 13,
wherein at least the first contact opening section extends with an angle of about 45° with respect to the {111} crystal plane.

* * * * *